United States Patent [19]

Katsura et al.

[11] Patent Number: 4,820,974
[45] Date of Patent: Apr. 11, 1989

[54] METHOD FOR MEASURING A CHARACTERISTIC OF SEMICONDUCTOR MEMORY DEVICE

[75] Inventors: Joji Katsura, Nishinomiya; Seiji Yamaguchi, Hirakata; Kazuhiko Tsuji; Eisuke Ichinohe, both of Katano, all of Japan

[73] Assignee: Matsushita Electric Industrial Co., Ltd., Osaka, Japan

[21] Appl. No.: 941,626

[22] Filed: Dec. 11, 1986

[30] Foreign Application Priority Data

Dec. 16, 1985 [JP] Japan .................. 60-283321

[51] Int. Cl.$^4$ .................. G01R 31/28; G01R 31/26
[52] U.S. Cl. .................. 324/73 R; 324/158 R; 371/21
[58] Field of Search .................. 324/73 R, 158 R; 371/13, 21, 38; 365/201

[56] References Cited

U.S. PATENT DOCUMENTS

| | | | |
|---|---|---|---|
| 3,576,982 | 5/1971 | Duke | 371/13 |
| 4,045,779 | 8/1977 | Markle | 371/13 |
| 4,271,519 | 6/1981 | Hall | 371/38 |
| 4,553,225 | 11/1985 | Ohe | 371/21 |
| 4,637,020 | 1/1987 | Schinabeck | 324/73 R |
| 4,686,456 | 8/1987 | Furuyama et al. | 324/73 R |

Primary Examiner—Ernest F. Karlsen
Assistant Examiner—Vinh P. Nguyen
Attorney, Agent, or Firm—Wenderoth, Lind & Ponack

[57] ABSTRACT

Method for measuring power supply current, e.g., standby current of a random access memory in which, before starting measurement of the power supply current, data is read-out from memory cell of the random access memory and opposite data is written in the memory cell so that the random access memory enters into an unstabilized state. By use of this method, the measurement of the maximum power supply current can be conducted precisely.

15 Claims, 4 Drawing Sheets

FIG. 2A

|   | $Y_0$ | $Y_1$ | $Y_2$ | $Y_3$ | | $Y_{m-1}$ |
|---|---|---|---|---|---|---|
| $X_0$ | 0 | 1 | 0 | 1 | | 0 |
| $X_1$ | 1 | 1 | 1 | 0 | | 1 |
| $X_2$ | 0 | 1 | 0 | 1 | | 0 |
| $X_3$ | 1 | 1 | 0 | 1 | | 1 |
| | | | | | | |
| $X_{n-1}$ | 1 | 0 | 1 | 0 | 0 | 1 |

FIG. 2B

|   | $Y_0$ | $Y_1$ | $Y_2$ | $Y_3$ | | $Y_{m-1}$ |
|---|---|---|---|---|---|---|
| $X_0$ | 1 | 0 | 1 | 0 | | 1 |
| $X_1$ | 0 | 0 | 0 | 1 | | 0 |
| $X_2$ | 1 | 0 | 1 | 0 | | 1 |
| $X_3$ | 0 | 0 | 1 | 0 | | 0 |
| | | | | | | |
| $X_{n-1}$ | 0 | 1 | 0 | 1 | 1 | 0 |

FIG. 5

| Data of Memory Cell | Power Supply Current |
|---|---|
| Normal State | 11.4 mA |
| After Opposite Data Write-In (locally) | 14.4 mA |
| Difference | 3.0 mA |

64 Kbit (8K×8bit) Static RAM
Mode: Chip Selection Mode $$\begin{cases} IWE = "H" \\ IOE = "L" \\ I/O\ Pin = "open" \end{cases}$$

METHOD FOR MEASURING A CHARACTERISTIC OF SEMICONDUCTOR MEMORY DEVICE

BACKGROUND OF THE INVENTION

This invention relates to method for measuring a characteristic of a semiconductor memory device, and more particularly to method for a measuring power supply current of a semiconductor memory device more precisely.

In general, various kinds of characteristics are described in a specification of a semiconductor memory device (e.g., RAM, i.e., random access memory). The characteristics include absolute maximum ratings, recommended operating conditions, electrical characteristics, and so on. These characteristics are important to designers who wish to evaluate semiconductor memory devices, to purchasers who are selecting better semiconductor memory devices before purchasing devices, and so on. One of the important characteristics is the power supply current, i.e., the power supply current in operating state and the power supply current in the standby state (standby power supply current). For example, a specification of a static RAM says that its standby power supply current is 10 mA at maximum. A designer who designs a product using a SRAM knows the data (10 mA maximum) from a specification and designs the product based upon the data. The data usually contains some clearance or margin. That is, some margin is added on actually measured standby current. If the measured standby current is wrong and the maximum standby current is higher than the measured one, the margin becomes smaller. In such a case, it may be risky for a designer to design a product based upon data shown in a specification. A similar situation occurs in purchasing semiconductor memory devices. A person, who is in charge of purchasing, generally uses characteristics of the specification for selecting devices which should be purchased. If such characteristics are wrong or are not correct, his purchase decision may be wrong.

Therefore, it is very important to know correct data, or to measure data correctly.

There are two cases to consider in measuring the power supply current to be consumed by a semiconductor memory device. One is a case wherein the measurement is conducted when a semiconductor memory device is operated, i.e., is in chip selection mode. The other is a case wherein the measurement is conducted when a semiconductor memory device is in a standby state, or chip non-selective mode. In these cases, particularly in the measurement in chip non-selection mode, the measurement is conducted regardless of what kind of data each memory cell of the memory device holds.

Generally, it is known that each memory cell tends to hold an arbitrary value of "0" or "1" when the power supply voltage is simply applied to a semiconductor memory device and, data has not yet been written in the memory device. This means that since each memory cell tends to reach a more stabilized state, it holds data of a "0" or "1". Each memory cell is stabilized under the situation that the leakage current from a memory cell to GND (Ground) or to $V_{DD}$ (power supply voltage) terminal is minimized after each memory cell holds one of "0" and "1".

A conventional measurement of power supply current is conducted under such a stabilized situation. Since the measurement is conducted under a static stabilized state, it is difficult to obtain a more precise maximum standby power supply current. That is, in case that a memory cell holds certain data, it is in more stabilized state than a case wherein it holds opposite data, i.e., data which are opposite to data which are stored in a memory cell under a stabilized state so that the power supply current, particularly standby current which is measured under the stabilized state becomes a lower current value.

In other words, the measured current value differs from the current value of a memory cell in the case that where some data is intentionally written in a memory cell. Therefore, it is difficult, in a conventional measurement method, to know the correct maximum value of the standby power supply current.

SUMMARY OF THE INVENTION

The present invention, therefore, has as its principal object the provision of an improved method for measuring characteristics of a semiconductor memory device by which a more precise measurement is possible.

This and other objects are accomplished by a method for measuring a characteristic of a semiconductor memory device which comprises supplying a power supply voltage to a semiconductor memory device to be measured so that said semiconductor memory device enters into an operating state, reading out data which is stored in at least one memory cell of the semiconductor memory device, preparing opposite data which is opposite to the read-out data, writing the opposite data in the memory cell, thereby completing the semiconductor memory device, and measuring a characteristic of the semiconductor memory device.

In a specific embodiment, the power supply voltage is turned off before supplying the power supply voltage to said semiconductor memory device. The semiconductor memory device is a random access memory. The data to be read out from said semiconductor memory device is all of the data stored in all of the memory cells. The opposite data is formed by inverting the read-out data with an inverter. Right after one data which is stored in one memory cell is read-out, opposite data is written in the memory cell. All data stored in all of the memory cells is read-out and thereafter opposite data is written in the memory cells. The characteristic to be measured is the power supply current. The power supply current includes the power supply current in operating state and the standby power supply current. The power supply current is measured in a chip selection mode of the semiconductor memory device. The power supply current is also measured in a non-chip selection mode. Further, the characteristic to be measured may include data holding power supply current, operating current, refresh current, and refresh period.

According to the present invention as described herein, the following benefit, among others, is obtained.

By use of the method of the invention, each memory cell of a semiconductor memory device enters in more unstabilized state so that DC leakage current flows more and more from each memory cell. As a result, it becomes possible to obtain a more precise maximum value of the DC power supply current and thereby to know the current value more precisely.

While the novel features of the invention are set forth with particularly in the appended claims, the invention, both as to organization and contents, will be better understood and appreciated, along with other objects and features thereof, from the following detailed description taken in conjunction with the drawings.

BRIEF DESCRIPTION OF THE DRAWINGS

FIG. 2A shows one example of data stored in a semiconductor memory device under its stabilized state;

FIG. 2B shows a case wherein opposite data are written in the semiconductor memory device;

FIG. 5 shows the measured actual power supply current value of a 64 K bit static RAM.

DESCRIPTION OF THE PREFERRED EMBODIMENTS OF THE INVENTION

Figure 1:
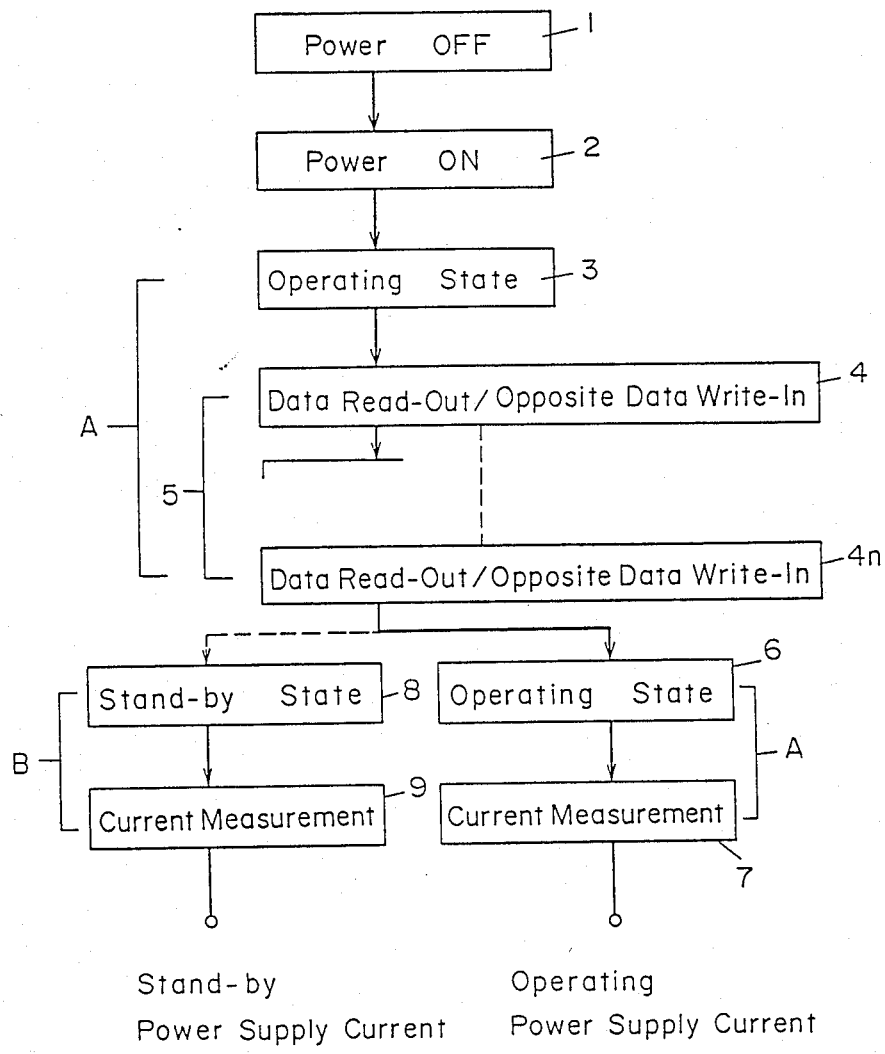
FIG. 1 is a flow chart showing one embodiment of the present invention.

One embodiment of the invention is explained with reference to FIGS. 1 and 2. FIG. 1 shows a flow chart describing sequence of a method for measuring the power supply current of a random access memory.

The power supply of a random access memory is turned OFF at step 1 and turned ON at step 2 so that the random access memory as a semiconductor memory device to be measured enters into chip-selection mode A and also in an operating state at step 3. Under this situation, the semiconductor memory device holds certain data which are data each memory cell naturally has upon the application of power supply voltage to the device. The data are shown in FIG. 2A. In FIGS. 2A, 2B, $X_0, X_1, \ldots, X_n$ and $Y_0, Y_1, \ldots Y_{m-1}$ show row addresses and column addresses, respectively. At step 4, one address selected from among all of the address areas is accessed and data stored in a memory cell which corresponds the accessed address is read out and, right after the completion of the read-out operation, opposite data is written into the same memory cell. For example, if "0" is the read-out data from a memory cell, "1" is written in the cell. Such an operation is repeated for all of the addresses, i.e., for all of the memory cells, in from step 4 through step 4n. As a result of the data change to all memory cells, each memory cell has data as shown in FIG. 2B.

After the completion of access step 5 to all of the addresses, initialization of the memory device to be measured is completed so that measurement operations can be possible. For example, at steps 6 and 7, it is possible to measure the power supply current under the operating condition of a semiconductor memory device, i.e., under chip selection mode A and at steps 8 and 9, it is possible to measure power supply current under the standby condition of a semiconductor memory device, i.e., under chip non-selection mode B. By these measurements, the operating power supply current or standby power supply current is obtained. The way of such measurement itself is conventional. Therefore, detailed explanation thereof is omitted.

As stated above, the most important step of the method of is step 5 in which data of a memiory cell are changed to opposite data. Such data changes may be applied to some of all the memory cells and, of course, to all of the memory cells. In any event, data of at least one memory cell must be changed at step 5.

Figure 3:
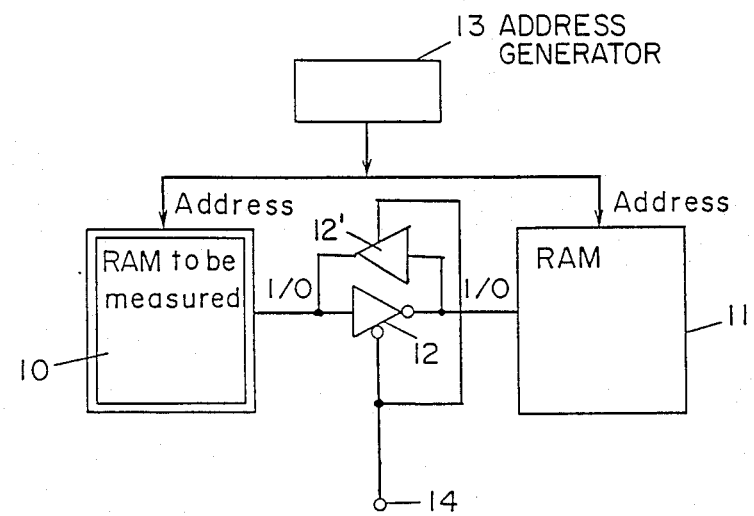
FIG. 3 is a block diagram of an apparatus which is used for the method of the present invention.

Such a data change can be conducted by use of an apparatus shown in FIG. 3. The semiconductor memory device 10 to be measured is coupled to a random access memory 11 through a tri-state inverter 12. That is, the I/O port of device 10 is connected to the I/O port of RAM 11. An address generator 13 is coupled to devices 10 and 11.

In operation, when data of one memory cell of device 10 is read-out, the read-out data is inverted by inverter 12 so that opposite data is produced. The opposite data is written into the corresponding memory cell of RAM 11 which is in its write state. Thereafter, RAM 11 is placed in its read-out state and device 10 is placed in its write state simultaneously. Then, the opposite data which is stored in RAM 11 is read-out, transferred by tri-state buffer 12' and written into the original memory cell of device 10. In this case, a control signal is applied to terminal 14 and the output of the tri-state inverter 12 becomes its high impedance state, i.e., no-inversion operation state, on the other side, the output of the tri-state buffer 12' becomes its pass-through state, so that inversion operation is not conducted and simultaneously a buffer operation is conducted. By the method stated above, a data change can be conducted.

Figure 4:
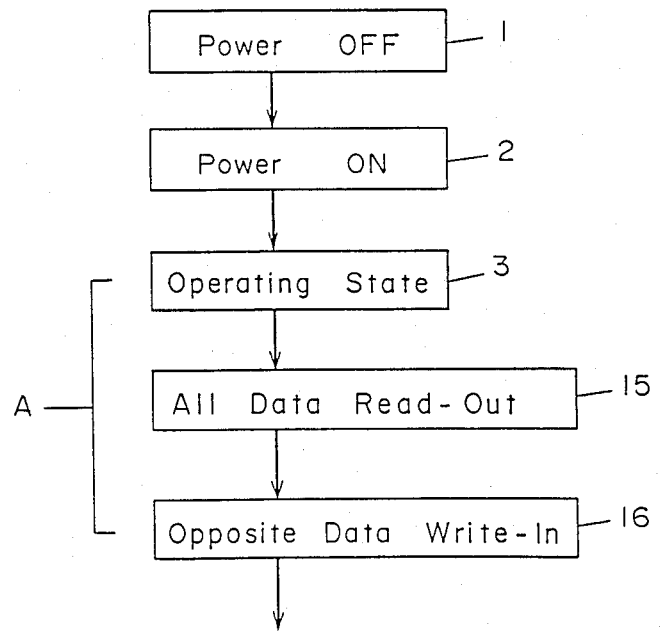
FIG. 4 is a flow chart showing another embodiment of the present invention.

FIG. 4 shows another example of the method of this invention. The basic flow is the same as in FIG. 1. What is different from FIG. 1 flow is steps 15 and 16. In the FIG. 3 flow, all of the stored in a semiconductor memory device are read-out at step 15 and, at step 16, opposite data are written into all of the memory cells from which data are read out at step 11. Such a data change can be conducted by the FIG. 3 apparatus.

FIG. 5 shows the result of an actual measurement of 64 K bit (8 K×8 bit) static RAM. The power supply current which is measured by conventional method in normal operating state is 11.4 mA. In contrast, the power supply current which is measured after opposite data is locally written into the RAM is 14.4 mA. The difference is 3.0 mA. That is, the value measured by the present method of the invention is larger than the value measured by a conventional method.

In the above embodiment, characteristics of a semiconductor memory device are its power supply current in its operating state and its standby power supply current. The characteristics are not limited to power supply current, but includes other data such as the holding power supply current ($I_{CCRD1}$, $I_{CCDR2}$) of SRAM, operating current ($I_{CC1}$), refresh current ($I_{CC3}$, $I_{CC5}$), refresh period ($t_{REF}$) and so on.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

What we claim is:

1. A method for measuring a characteristic of a semiconductor memory device having memory cells comprising:

supplying a power supply voltage to a semiconductor memory device to be measured so that said semiconductor memory device enters into an operating state;

reading out data which is stored in at least one memory cell of the semiconductor memory device;

preparing opposite data which is opposite to the read-out data;

writing said opposite data in said memory cell, thereby completing initialization of the semiconductor memory device; and measuring a characteristic of the semiconductor memory device.

2. A method as recited in claim 1, wherein said power supply voltage is turned off before supplying said power supply voltage to said semiconductor memory device.

3. A method as recited in claim 1, wherein said semiconductor memory device is a random access memory.

4. A method as recited in claim 1, wherein said data to be read out from said semiconductor memory device is all data which are stored in all of the memory cells.

5. A method as recited in claim 1, wherein said data which is opposite is formed by inverting said read-out data with an inverter.

6. A method as recited in claim 1, wherein right after data which is stored in one memory cell has been read-out, opposite data is written in said memory cell.

7. A method as recited in claim 1, wherein all of the data stored in all of the memory cells are read-out and thereafter opposite data are written in said memory cells.

8. A method as recited in claim 1, wherein said characteristic to be measured is power supply current.

9. A method as recited in claim 8, wherein said power supply current includes an operating power supply current and a standby power supply current.

10. A method as recited in claim 8, wherein said power supply current is measured in a chip selection mode of said semiconductor memory device.

11. A method as recited in claim 8, wherein said power supply current is measured in a non-chip selection made.

12. A method as recited in claim 1, wherein said characteristic to be measured includes data holding power supply current, operating current, refresh current, and refresh period of the memory device.

13. A method for measuring power supply current of a random access memory having memory cells comprising:

supplying a power supply voltage to a random access memory to be measured so that said random access memory enters into an operating state;

reading out data which is stored in one memory cell of said random access memory;

preparing opposite data which is opposite to the read-out data;

writing said opposite data in said memory cells;

repeating the steps of reading out, preparing opposite data and writing; and measuring power supply current of said random access memory.

14. A method as recited in claim 13, wherein said repeating step is conducted until all data of all of the memory cells are changed to data which is opposite.

15. A method for measuring power supply current of a random access memory having memory cells comprising:

supplying power supply voltage to a random access memory to be measured so that said random access memory enters into an operating state;

reading out all data which are stored in all of the memory cells of said random access memory;

preparing opposite data which are opposite to the read-out data;

writing said opposite data in all of the memory cells; and measuring power supply current of said random access memory.

* * * * *